United States Patent

Bailey

[15] 3,640,783

[45] Feb. 8, 1972

[54] SEMICONDUCTOR DEVICES WITH DIFFUSED PLATINUM

[72] Inventor: Robert F. Bailey, Los Alamitos, Calif.

[73] Assignee: TRW Semiconductors Inc., Lawndale, Calif.

[22] Filed: Aug. 11, 1969

[21] Appl. No.: 848,928

[52] U.S. Cl. ........................148/186, 148/188, 317/235 AQ

[51] Int. Cl. ........................................................H01l 7/34

[58] Field of Search ...........................148/1.5, 186, 188, 189

[56] References Cited

UNITED STATES PATENTS 3,067,485 12/1962 Ciccolella et al. .....................148/186

3,486,950 12/1969 Lesk .....................................148/186

*Primary Examiner*—L. Dewayne Rutledge

*Assistant Examiner*—J. Davis

*Attorney*—Spensley, Horn & Lubitz

[57] ABSTRACT

A semiconductor device having platinum dispersed throughout said device. The dispersion of platinum within a semiconductor device results in improved electrical characteristics of the device. In a silicon diode, the improved characteristics include the reduction of reverse recovery time and an increase in the breakdown voltage. In a silicon transistor, the improved characteristics include the achievement of high switching speeds while maintaining high forward current gain.

4 Claims, 6 Drawing Figures

INVENTOR.

ROBERT F. BAILEY,

By His Attorneys Spensley & Horn.

SEMICONDUCTOR DEVICES WITH DIFFUSED PLATINUM

BACKGROUND OF THE INVENTION

1. Field of the Invention

The present invention relates to the field of semiconductor devices, and specifically to the diffusion of platinum throughout the body of the device to improve the electrical characteristics of the device.

2. Prior Art

The current use of semiconductor devices to implement electronic systems far surpasses the use of vacuum tubes. The modern electronic systems, e.g., digital computers and telemetry systems, require components which can be used over broad frequency and power ranges. The need for components which possess high switching speeds and/or high current gain characteristics have resulted in the development of the present invention.

The basic silicon devices as disclosed by the prior art were adequate until the speed, gain and other electrical requirements imposed by modern electronic systems surpassed the then existing state of the art. In the case of a silicon diode, the overall speed is to a great extent dependent upon the recovery time of the diode after the bias voltage across the diode is changed from a forward to a reverse condition, i.e., the time required to return from a low impedance to a high impedance condition. In a PN-junction, the reverse recovery time is a function of the lifetime of the minority carriers, therefore, in a diode, the faster the minority carriers can be recombined, i.e., the lower the lifetime, the faster the switching speed. The faster switching speed is synonymous with a faster reverse recovery time.

The prior art discloses the use of gold to reduce the recovery time in diodes. Gold was diffused throughout the body of the diode, the gold providing additional recombination centers in the silicon material. With the enhanced recombination of the minority carriers, the reverse recovery time of the diode was reduced.

The problem left unresolved by the prior art relates to the degraded reverse electrical characteristics which accompany the use of gold as a depressant of minority carrier lifetimes. For example, the dispersion of gold throughout the body of the diode has the effect of increasing the reverse current in the reversed biased PN-junction. The present invention solves the problems left unresolved by the prior art by diffusing platinum into the silicon device in place of gold. The use of platinum is suggested by prior art, but the critical manner of its utilization to achieve the unknown and desired results is not taught.

The prior art does not disclose any means whereby the diffusion of a material will reduce the switching time of a transistor without the accompanying degradation of current gain nor does the prior art even suggest that such can be accomplished. Since a transistor is basically a minority carrier device, the reduction of the lifetime of the minority carriers is contra to the principle of high current gain. To illustrate this principle, when minority carriers are injected into the base region from the emitter region of a transistor, the lower the rate of minority carrier recombination, the smaller will be the required base current. For a given collector current, the smaller the required base current the higher the forward current transfer ratio, i.e., gain. Since gold provides indiscriminate minority carrier recombination, the decrease in the reverse recovery time is at the expense of a degradation of current gain. The present invention solves this problem by diffusing platinum in a particular manner throughout the silicon transistor. The platinum acts to reduce the switching time of the device without the very substantial loss of the current gain accompanying a diffusion process utilizing gold.

In addition, the use of gold will degrade the reverse electrical characteristics of a transistor, i.e., increased reverse leakage current. The use of platinum, as taught by the present invention, alleviates the heretofore unresolved problems.

SUMMARY OF THE INVENTION

It is an object of the present invention to provide a semiconductor device which has improved switching speeds.

It is another object of the present invention to provide a PN-junction in which an impurity is injected to reduce the lifetime of minority carriers without a corresponding degradation of electrical characteristics.

It is still another object of the present invention to provide a method to fabricate semiconductor devices having high switching speeds without a loss of beneficial electrical characteristics.

It is yet another object of the present invention to provide a transistor which has improved switching speeds and high current gain.

It is still yet another object of the present invention to provide diodes having uniform low values of reverse recovery time with a corresponding improvement in forward and reverse electrical characteristics.

The primary object of the present invention is to provide a semiconductor device which will exhibit improved switching speed without suffering a severe degradation of other electrical characteristics. A measure of switching speed is the reverse recovery time of the device, therefore, it is appropriate to define the term. A forward biased PN-junction will conduct a given amount of forward current. If at time ($t_o$) a reverse biased pulse is applied to the PN-junction, the time between the start of the pulse ($t_o$) and the time ($t_l$) when the reverse bias current through the PN-junction reaches 10 percent of its maximum value is defined as the reverse recovery time ($t_{rr}$). In other words:

$$t_{rr}=t_l-t_o$$

In the case of a PN-junction (diode), the reverse recovery time is primarily a function of the lifetime of the minority carriers in the semiconductor material, i.e., the time required for recombination.

The present invention utilizes the diffusion of platinum throughout the body of the device. The dispersion of platinum in the semiconductor diode serves to depress the lifetime of the minority carriers. The speed achieved with diffused platinum in accordance with the present invention method is substantially faster than that achieved with diffused gold. In addition, a diffused platinum device produced in accordance with the present invention produces results which are unexpected in light of the prior art. The use of platinum is discussed by the prior art, but the reference is so general in nature as to clearly omit the objectives sought and fulfilled by the present invention. A silicon diode diffused with platinum has a lower leakage current, faster switching speed, and higher breakdown voltage than a similar device diffused with gold.

In the case of a transistor, diffusing platinum throughout the body of the device by subjecting the material to a temperature range of 925°–965° C. will reduce the switching time without destroying the forward current gain. It is believed that a dichotomy exists because of the fact a transistor is primarily a minority carrier device, and the nonrecombination of minority carriers is the basis of high current gain. Although the precise reason has not yet been discovered, it is believed that diffused platinum causes the recombination of the free holes and not recombination of the free electrons. This result enables a transistor with platinum diffused throughout to have a lower switching time than either a standard transistor, or one diffused with gold, and in addition, the gain of the device is substantially greater than one diffused with gold.

The present invention method can be utilized to fabricate one or more diodes or transistors at the same time, therefore, it is applicable to the manufacture of integrated circuits.

The novel features which are believed to be characteristic of the invention, both as to its organization and method of operation, together with further objectives and advantages thereof will be better understood from the following description considered in connection with the accompanying drawings in which a presently preferred embodiment of the invention is illustrated by way of example. It is to be expressly understood, however, that the drawings are for the purpose of illustration and description only, and are not intended as a definition of the limits of the invention.

DESCRIPTION OF THE PRESENTLY PREFERRED EMBODIMENTS

Figure 1:
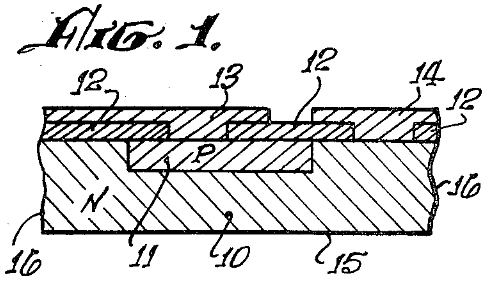
FIG. 1 is a sectional view of a PN-junction fabricated in accordance with the present invention.

A first preferred embodiment of the present invention can be illustrated by reference to FIG. 1 wherein a diode is shown for the purpose of example. A typical diode, as shown in FIG. 1, comprises a silicon substrate 10 of N-type conductivity into which is diffused an active region 11 of P-type conductivity. A passivating layer 12, typically silicon-dioxide is disposed upon the surface of the silicon wafer after which conventional etching techniques are used to prepare the silicon wafer for a conventional deposition of the metal contacts 13 and 14. It is to be understood that the method of preparing the diode can be by conventional, known techniques and does not constitute a part of the present invention. The diode shown in FIG. 1 is for the purpose of example only.

A diode prepared in accordance with the present invention will be by conventional techniques, but prior to the deposition of the metal contacts 13 and 14, platinum is diffused throughout the silicon wafer. The bottom surface 15 and/or the side surfaces 16 are coated with a thin layer of platinum. The deposition of the platinum may be accomplished by conventional, known techniques, but it is preferably carried out by evaporation or sputtering. The silicon wafer is then heated to a temperature of the range of 925°–965° C. for a time which is adequate to diffuse the platinum throughout the body of the silicon wafer. The time will be consistent with the temperature, the desired results being the achievement of a substantially uniform dispersion of the platinum in the silicon wafer. The prior art briefly discloses the use of platinum as a depressant of the lifetime of minority carriers, but the range of temperatures disclosed is far too broad. The temperature disclosed herein is important to achieve the objective of non-degradation of electrical properties. After the platinum is diffused into the silicon wafer, the metal contacts 13 and 14 will be disposed upon the region 11 of P-type conductivity and the region 10 of N-type conductivity respectively.

A diode prepared in accordance with the present invention will exhibit a lower reverse recovery time, i.e., higher switching speed, than either a standard diode or one diffused with gold. In addition, the electrical characteristics of the diode will be substantially better than those found in a diode fabricated in accordance with that disclosed by the prior art.

The reverse recovery time ($t_{rr}$) of a diode is determined by measuring the time in which the PN-junction returns to a high impedance state after the removal of an electrical pulse which subjects the PN-junction to a forward biased condition. Referring now to FIG. 1, if the diode shown therein was forward biased, free electrons would move across the PN-junction from region 10 to region 11, the free holes moving from region 11 to region 10. When the diode is reverse biased, the faster the depletion layer at the PN-junction can be cleared of the minority carriers, the faster will be the switching time. The platinum dispersed throughout the diode in accordance with the present invention will result in recombination centers which will depress the lifetime of the minority carriers, thereby giving substantially faster switching speeds.

It is well known in the art that gold will act as a depressant of the lifetime of minority carriers in a diode, but the use of platinum is substantially better, and in addition, heretofore unexpected results occur. Experiments performed on a PN-junction have established that the reverse recovery time of those devices fabricated in accordance with the present invention is substantially lower than the reverse recovery time of those fabricated in accordance with a gold diffusion process. The use of platinum to depress the lifetime of minority carriers has been alluded to by the prior art, but the attainment of good electrical characteristics was totally neglected. All of the empirical data described herein utilized a PN-junction diffused with platinum in a temperature range of 925°–965° C. This produced a device which was substantially better than one using the gold diffusion process. It was also found that diffusion temperatures exceeding 1,000° C. produced platinum diffused devices which were at best only slightly improved, and generally of lower quality than those devices produced pursuant to a gold diffusion process.

Figure 3:
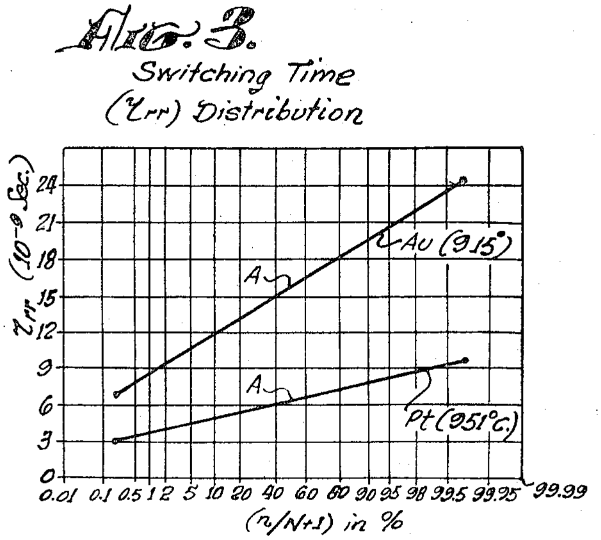
FIG. 3 is a graph relating the statistical probability of values of reverse recovery time in a PN-junction.

Referring now to FIG. 3, a probability distribution of devices relative to the reverse recovery time is shown therein. The ordinate of the graph is the reverse recovery time measured in nanoseconds; the abscissa represents a number of devices out of a total sample, the value measured in percent of the total sample. At point A, 50 percent of the PN-junctions fabricated in accordance with the present invention will have reverse recovery time of approximately 6.5 nanoseconds or less whereas 50 percent of the PN-junctions fabricated with gold diffused therein will have a reverse recovery time equaling approximately 16 nanoseconds or less.

Figure 4:
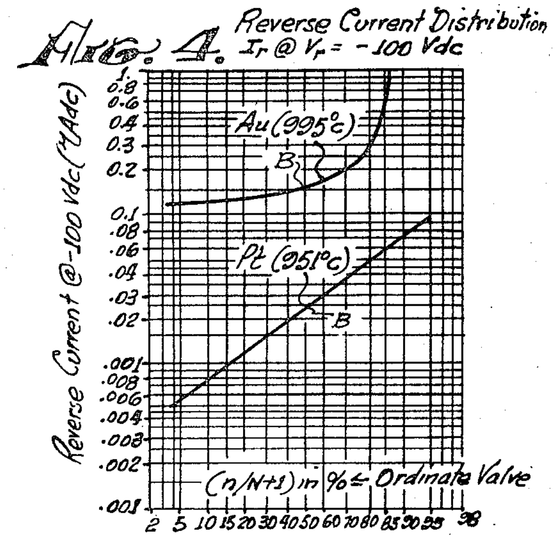
FIG. 4 is a graph relating the statistical probability of values of reverse current in a PN-junction.

Referring now to FIG. 4, a probability distribution of PN-junctions relative to the reverse current through the junction is shown therein. The ordinate of the graph is measured in microamperes; the abscissa is calibrated to represent the total number of a sample, the value stated as a percentage of the total sample. The reverse current being a measure of the current through a junction under a reversed bias condition, there can be serious problems if the figure is excessive. At point B, 50 percent of the PN-junctions fabricated in accordance with the present invention will have a reverse current of approximately 0.025 microamperes or less; 50 percent of the PN-junctions fabricated pursuant to the gold diffusion process will have a reverse current of approximately 0.16 microamperes or less.

The maximum reverse bias which a typical PN-junction can safely tolerate is defined as the breakdown voltage. There will generally be a small leakage current under a reverse biased condition because of the small number of hole-electron pairs which are thermally generated in the vicinity of the junction. The charges of the donor and acceptor atoms in the depletion region generate a voltage which is equal and opposite to the reverse bias voltage applied to the terminals of the junction. As the reverse bias voltage is increased a point will be reached where the electrons crossing the junction (leakage current) can acquire sufficient energy to produce additional hole-electron pairs upon collision with the semiconductor atoms. The voltage at which this occurs is the breakdown voltage. The use of platinum as a depressant of the lifetime of the minority carriers increases the breakdown voltage of the PN-junction in a manner which is unexpected from that taught by the prior art. A probability distribution of the breakdown voltage of PN-junctions can be best seen by reference to FIG. 5. Looking at point C, 50 percent of the sample of PN-junctions fabricated in accordance with the gold diffusion process will have a breakdown voltage which is approximately 150 volts or greater whereas 50 percent of the sample of PN-junctions produced in accordance with the present invention have a breakdown voltage which is approximately 175 volts, or greater.

Figure 5:
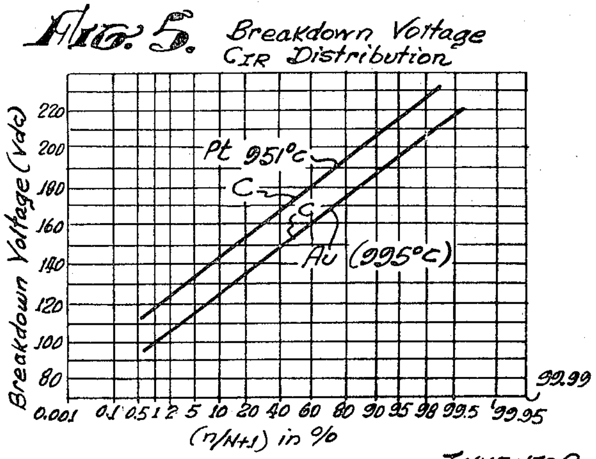
FIG. 5 is a graph relating the statistical probability of values of breakdown voltage in a PN-junction; and, FIG. 6 is a graph relating the statistical probability of values of current gain in transistors diffused with gold or platinum.

The data presented in FIGS. 3, 4 and 5 represent results which are totally unexpected in light of the prior art. Experimentation has established that a temperature range of 925°–965° C. is a dominant factor in producing the heretofore unexpected results exhibited by platinum diffused devices.

Figure 2:
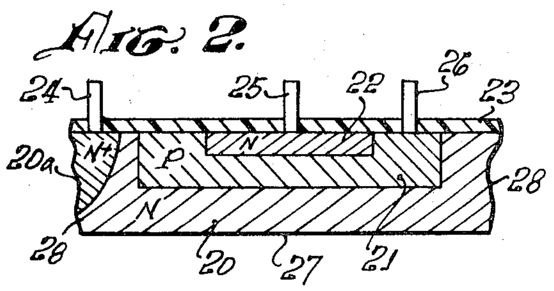
FIG. 2 is a sectional view of a diffused transistor fabricated in accordance with the present invention.

Another embodiment of the present invention can be best seen by reference to FIG. 2 wherein a transistor is illustrated. The transistor shown in FIG. 2 is a typical diffused transistor. A silicon wafer 20 of N-type conductivity is the initial starting material. Through the use of conventional oxidation and masking techniques, the base region 21 and the emitter region 22 are diffused into the silicon wafer 20. The base region 21 is of P-type conductivity and utilizes conventional dopants, typically boron. The emitter region 22 is of N-type conductivity utilizing a conventional dopant, typically phosphorus. For the purpose of example, the highly doped $N^+$ region **20*a* is diffused into the basic silicon wafer 20. The $N^+$ region 20*a* will facilitate improved electrical connections. The passivating layer 23 will be conventionally etched to provide access to the active regions for the attachment of the metal contacts 24, 25 and 26**.

Prior to the deposition or other conventional attachment of the metal contacts 24, 25 and 26, the transistor will be processed in accordance with the present invention. A layer of platinum is disposed upon the side surfaces 28 and/or the bottom surface 27 by conventional means, but preferably by evaporation or sputtering. The silicon transistor with the disposed platinum layer is then heated to a temperature range of 925°–965° C. for a time which is sufficient to fully disperse the platinum throughout the body of the silicon transistor. After the platinum is diffused into the transistor, the metal contacts 24, 25 and 26 are electrically connected to the active regions **20*a*, 22 and 21** respectively. The described manner in which the transistor is fabricated is for the purpose of example only and is not intended to limit the scope of the present invention.

The use of platinum to depress the lifetime of minority carriers in a transistor results in a dichotomy. A transistor is a current gain device, therefore, any process which would deteriorate the current gain, even at the expense of higher switching speeds, is at best of limited benefit. For example, in the case of an NPN-transistor, the base-emitter junction is forward biased with the result electrons are injected by the emitter into the base region. The electrons diffuse through the base region and flow across the collector junction. The greater the efficiency of the flow of electrons traversing the base region, the lower the needed base current relative to a given collector current, therefore, a high gain device is produced. If the minority carriers are indiscriminately recombined, the gain must be decreased thereby limiting the effectiveness of the transistor. Although the precise explanation is not yet known, it is believed diffused platinum is a hole trap and not an electron trap whereas gold is an indiscriminate trap of minority carriers.

Figure 6:
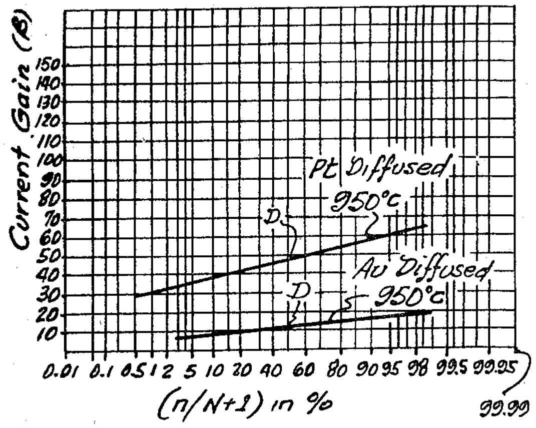

Empirical data derived from NPN-transistors provide evidence that the forward current transfer ratio of a transistor diffused with platinum, fabricated according to the present invention, will be substantially greater than one which has been diffused with gold. FIG. 6 compares the probability distribution of the current gain of transistor fabricated in accordance with the present invention with ones fabricated pursuant to a gold diffusion process. The ordinate is representative of the forward current gain (*b*); the abscissa is calibrated to measure the number of transistors out of the total sample, the number being normalized as a percentage. At point (D), 50 percent of the transistors fabricated in accordance with the present invention have a current gain of approximately 50 or less whereas 50 percent of gold diffused transistors have a current gain of approximately 14 or less.

The transistor fabricated in accordance with the present invention will have a switching speed which surpasses that of a gold diffused device, and in addition will not have a degraded gain figure. As an example of switching speed, given a standard transistor with a total turn-on and turn-off time of approximately 250 nanoseconds, the gold diffused device has a total on-off time of approximately 100 nanoseconds, with the transistor fabricated in accordance with the present invention lowering the total on-off time to approximately 50 nanoseconds. As a corollary to switching speed, a standard transistor having a forward current gain of approximately 70 will typically have a current gain of approximately 20 when gold is diffused throughout the device. The diffusion of platinum into a standard device will lower the forward current gain ratio to approximately 60, a figure which is substantially improved over that attained with a gold diffused device.

Diffusing platinum into a silicon transistor in accordance with the present invention results in electrical characteristics which are totally unexpected in light of the prior art. The use of a transistor with gold diffused throughout will give junction characteristics similar to that described for a diode, e.g., increased leakage current. The diffusion of platinum in accordance with the present invention yields a device which has a switching speed which substantially surpasses a standard transistor, and which has other electrical characteristics which are not substantially degraded from the standard device. The data set out below compares a statistical sample of transistors fabricated in accordance with the present invention against a corresponding statistical sample of standard transistors.

| Characteristic | $\beta$ | $\beta$ | $\beta$ | $V_{ce}$ | $V_{ces}$ | $V_{ebo}$ | $I_{cbo}$ |
|---|---|---|---|---|---|---|---|
| Conditions | $V_{ce}=5$ v, $I_c=100$ ma | $V_{ce}=5$ v, $I_c=150$ ma | $V_{ce}=5$ v, $I_c=400$ ma | Sat | $I_c=1$ ma | $I_e=1$ ma | $V_{cb}=75$ v. |
| Standard | 61 | 65 | 77 | .184 | 102 | 6.8 | .010. |
| Platinum diffused | 51 | 52 | 55 | .35 | 170 | 6.8 | .019. |
| Degradation (percent of standard) | .84 | .80 | .72 | 1.90 | 1.66 | 1.00 | 1.90. |

It has been found that a gold diffused transistor will generally degrade the electrical characteristics of a standard transistor by more than one order of magnitude as opposed to the figures shown above for a device fabricated in accordance with the present invention.

I claim:

1. An improved method of manufacturing a silicon electrical translating device having a substantially improved forward current transfer ratio and signal switching speed including at least one PN-junction in a silicon crystal body, the improvement comprising the step of diffusing platinum throughout said body by heating said body in the presence of platinum to a temperature of the range of 925°–965° C. for a time sufficient to diffuse platinum atoms substantially throughout said body.

2. A method for the fabrication of a silicon diode comprising the steps of:

a. providing a silicon crystal body having a PN-junction being disposed therein; and b. heating said silicon crystal body in the presence of platinum to a temperature in the range of 925°–965° C. for a time sufficient to diffuse platinum atoms substantially throughout said silicon crystal.

3. A method for the fabrication of a transistor comprising the steps of:

a. providing a silicon crystal body with a first region of a first-conductivity type being disposed between and contiguous to a pair of second regions of a second conductivity type; and b. diffusing platinum throughout said body by heating said body in the presence of platinum to a temperature in the range of 925°–965° C. for a time sufficient to substantially disperse platinum atoms through said silicon crystal body whereby a transistor is produced having a substantially improved forward current transfer ratio and reduced switching speed.

4. A method as in claim 3, wherein a silicon crystal body with an NPN-transistor disposed therein is provided.

* * * * *